United States Patent
Ottens et al.

(10) Patent No.: US 7,453,063 B2
(45) Date of Patent: Nov. 18, 2008

(54) CALIBRATION SUBSTRATE AND METHOD FOR CALIBRATING A LITHOGRAPHIC APPARATUS

(75) Inventors: Joost Jeroen Ottens, Veldhoven (NL); Jeroen Johannes Sophia Maria Mertens, Duizel (NL); Frederick Eduard De Jong, Eindhoven (NL); Koen Goorman, Eindhoven (NL); Boris Menchtchikov, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 884 days.

(21) Appl. No.: 11/006,819

(22) Filed: Dec. 8, 2004

(65) Prior Publication Data

US 2006/0119830 A1    Jun. 8, 2006

(51) Int. Cl.
*H01J 37/256* (2006.01)
*H01L 21/00* (2006.01)
*G03B 27/58* (2006.01)

(52) U.S. Cl. ............. 250/306; 250/307; 250/310; 250/492.2; 250/492.3

(58) Field of Classification Search ............. 250/306, 250/307, 310, 492.2, 492.3
See application file for complete search history.

(56) References Cited

U.S. PATENT DOCUMENTS

| 5,674,650 | A | 10/1997 | Dirksen et al. ............. 430/22 |
| 5,969,441 | A | 10/1999 | Loopstra et al. ........... 310/12 |
| 6,262,796 | B1 | 7/2001 | Loopstra et al. ........... 355/53 |
| 6,710,849 | B2 * | 3/2004 | Kwan et al. ............... 355/53 |
| 2007/0058152 | A1 * | 3/2007 | Zaal et al. ................. 355/77 |

* cited by examiner

*Primary Examiner*—Nikita Wells
(74) *Attorney, Agent, or Firm*—Pillsbury Winthrop Shaw Pittman, LLP (57) ABSTRACT

A calibration substrate for use during calibration of a lithographic apparatus is disclosed. The calibration substrate includes a first substantially flat surface, a second substantially flat surface that is substantially parallel to the first surface, and an edge that connects the first surface to the second surface. The calibration substrate has a thermal expansion coefficient of less than about $1.0 \times 10^{-6}$ $K^{-1}$ to reduce deformation thereof due to thermal changes in the substrate while in the lithographic apparatus.

45 Claims, 4 Drawing Sheets

CALIBRATION SUBSTRATE AND METHOD FOR CALIBRATING A LITHOGRAPHIC APPARATUS

FIELD

The present invention relates to a calibration substrate and a method for calibrating a lithographic apparatus with the calibration substrate.

BACKGROUND

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern-onto the target portion in one go, and so-called scanners, in which each target portion is irradiated by scanning the pattern through the projection beam in a given direction (the "scanning"-direction) while synchronously scanning the substrate parallel or anti-parallel to this direction.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, so that the individual devices can be mounted on a carrier, connected to pins, etc. Further information regarding such processes can be obtained, for example, from the book "Microchip Fabrication: A practical Guide to Semiconductor Processing", Third Edition, by Peter van Zant, McGraw Hill Publishing Co., 1997, ISBN 0-07-067250-4.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example, in order to create a multi-layer IC, so that the term substrate as used herein may also refer to a substrate that already contains multiple processed layers.

The terms "radiation" and "beam" as used herein encompass all types of electromagnetic radiation, including ultra-violet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" as used herein should be broadly interpreted as referring to a device that can be used to impart a projection beam with a pattern in its cross-section so as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support structure may be a frame or table, for example, which may be fixed or movable as required and which may ensure that the patterning device is at a desired position, for example, with respect to the projection system. Any use of the terms "reticle" or "mask" herein may be considered synonymous with the more general term "patterning device".

The term "projection system" as used herein should be broadly interpreted as encompassing various types of projection system, including refractive optical systems, reflective optical systems, and catadioptric optical systems, as appropriate, for example, for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

When lithographic apparatus are initially installed, and when apparatus have been taken down for maintenance, several calibrations are typically completed to ensure that the patterning device and substrate are oriented properly and move properly with respect to each other. Also, a calibration to ensure that there is proper focus on the substrate is also typically completed. For example, the X and Y axes at the wafer stage should be perpendicular to each other, and the substrate table, and hence substrate, should be moved precisely along the X and Y axes. The focus depths for a given patterning device should also be corrected prior to operating the machine in a production mode. Calibrations help ensure that the image that is printed on the substrate is not distorted in any way so that the resulting IC will operate properly.

During calibration, a calibration substrate is used so that an image, such as an alignment marker, that is on the patterning device may be imaged onto a target portion of the calibration substrate. Measurements are made on the calibration substrate to determine the accuracy of several operating parameters of the apparatus.

The calibration substrate is typically made from silicon and is coated with a radiation-sensitive material. Dimensions of the typical substrate, whether it be for production or for calibration, follow standards and specifications set forth by the Semiconductor Equipment and Materials Institute ("SEMI"), such as SEMI M1-0704 Specifications for Polished Monocrystalline Silicon Wafers, and SEMI M1.15-0704 Standard for 300 mm Polished Monocrystalline Silicon Wafers (Notched), both of which are incorporated herein by reference in their entireties.

However, due to the relatively large thermal expansion coefficient of silicon, the calibration quality may be negatively affected by temperature variations of the substrate before and during exposure. These thermal variations may be especially large during specific calibrations that use a longer exposure time to complete, as well as on the immersion-type apparatus described above. Because the temperature variations are difficult to predict from one calibration to another, the expansion of the silicon substrate is difficult to predict and may greatly vary. This may hamper accurate calibration of the lithographic apparatus.

SUMMARY

It is an aspect of the present invention to provide a calibration method for a lithographic projection apparatus that is not substantially affected by temperature variations before and during exposure.

In one embodiment, a calibration substrate for use during calibration of a lithographic apparatus is provided. The calibration substrate includes a first substantially flat surface, a second substantially flat surface that is substantially parallel to the first surface, and an edge that connects the first surface to the second surface. The calibration substrate has a thermal expansion coefficient of less than about $1.0 \times 10^{-6}$ $K^{-1}$ to reduce deformation thereof due to thermal changes in the substrate while in the lithographic apparatus.

In another embodiment, a method for calibrating a lithographic apparatus is provided. The method includes imaging a marker provided on a patterning device onto a radiation-sensitive layer on a calibration substrate with a beam of radiation, measuring a property of the image of the marker on the calibration substrate, determining any error between the measured property and an expected property based on the marker and operating parameters of the apparatus, and adjusting at least one of the operating parameters of the apparatus to correct for the error. The calibration substrate includes a first substantially flat surface, a second substantially flat surface that is substantially parallel to the first surface, and an edge that connects the first surface to the second surface. The calibration substrate has a thermal expansion coefficient of less than about $1.0 \times 10^{-6}$ $K^{-1}$ to reduce deformation thereof due to thermal changes in the substrate while in the lithographic apparatus.

In another embodiment, a method for manufacturing a device using a lithographic apparatus is provided. The method includes calibrating the lithographic apparatus with a calibration substrate. The calibration substrate includes a first substantially flat surface, a second substantially flat surface that is substantially parallel to the first surface, and an edge that connects the first surface to the second surface. The calibration substrate has a thermal expansion coefficient of less than about $1.0 \times 10^{-6}$ $K^{-1}$ to reduce deformation thereof due to thermal changes in the substrate while in the lithographic apparatus. The method also includes patterning a beam of radiation and projecting the patterned beam of radiation onto a target area on a production substrate.

In another embodiment, a lithographic apparatus in combination with a calibration substrate for use during calibration of the lithographic apparatus is provided. The lithographic apparatus includes an illumination system for conditioning a beam of radiation, and a support structure for supporting a patterning device. The patterning device serves to impart the beam of radiation with a pattern in its cross-section. The apparatus also includes a substrate table for holding the calibration substrate, and a projection system for projecting the patterned beam of radiation onto a target portion of the calibration substrate. The calibration substrate includes a first substantially flat surface, a second substantially flat surface that is substantially parallel to the first surface, and an edge that connects the first surface to the second surface. The calibration substrate has a thermal expansion coefficient of less than about $1.0 \times 10^{-6}$ $K^{-1}$ to reduce deformation thereof due to thermal changes in the substrate while in the lithographic apparatus.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
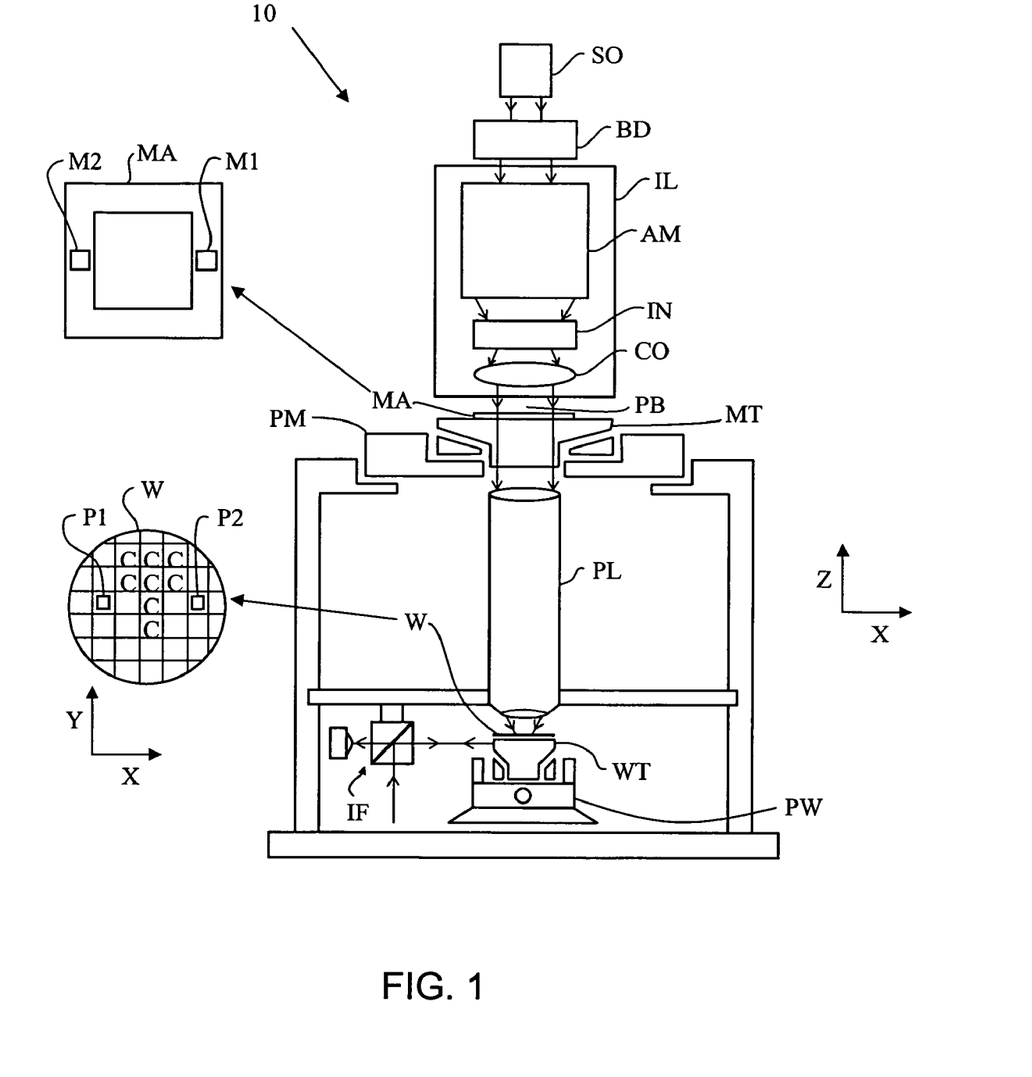
FIG. 1 depicts a lithographic apparatus according to an embodiment of the invention.

FIG. 1 schematically depicts a lithographic apparatus according to a particular embodiment of the invention. The apparatus includes: an illumination system (illuminator) IL for providing a projection beam PB of radiation (e.g. UV radiation, EUV radiation or an other type of radiation); a first support structure (e.g. a mask table) MT for supporting a patterning device (e.g. a mask) MA and connected to a first positioning device PM for accurately positioning the patterning device with respect to item PL; a substrate table (e.g. a wafer table) WT for holding a substrate (e.g. a resist-coated wafer) W and connected to a second positioning device PW for accurately positioning the substrate with respect to item PL; and a projection system (e.g. a refractive projection lens) PL for imaging a pattern imparted to the projection beam PB by the patterning device MA onto a target portion C (e.g. including one or more dies) of the substrate W.

As here depicted, the apparatus is of a transmissive type (e.g. employing a transmissive mask). Alternatively, the apparatus may be of a reflective type (e.g. employing a programmable mirror array of a type as referred to above).

The illuminator IL receives a beam of radiation from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be integral part of the apparatus, for example, when the source is a mercury lamp. The source SO and the illuminator IL, together with the beam delivery system BD if required, may be referred to as a radiation system.

The illuminator IL may include an adjusting device AM for adjusting the angular intensity distribution of the beam. Generally, at least the outer and/or inner radial extent (commonly referred to as R-outer and c-inner, respectively) of the intensity distribution in a pupil plane of the illuminator may be adjusted. In addition, the illuminator IL generally includes various other components, such as an integrator IN and a condenser CO. The illuminator provides a conditioned beam of radiation, referred to as the projection beam PB, having a desired uniformity and intensity distribution in its cross-section.

The projection beam PB is incident on the mask MA, which is held on the mask table MT. Having traversed the mask MA, the projection beam PB passes through the lens PL, which focuses the beam onto a target portion C of the substrate W. With the aid of the second positioning device PW and position sensor IF (e.g. an interferometric device), the substrate table WT may be moved accurately, e.g. so as to position different target portions C in the path of the beam PB. Similarly, the first positioning device PM and another position sensor (which is not explicitly depicted in FIG. 1) may be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper (as opposed to a scanner) the mask table MT may be connected to a short stroke actuator only, or may be fixed. Mask MA and substrate W may be aligned using mask alignment marks M1, M2 and substrate alignment marks P1, P2.

The depicted apparatus may be used in the following example modes:

1. In step mode, the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

Combinations and/or variations on the above described modes of use or entirely different modes of use may also be employed.

Until recently, lithographic apparatus typically contained a single mask table and a single substrate table. However, machines are now available in which there are at least two independently moveable substrate tables; see, for example, the multi-stage apparatus described in U.S. Pat. Nos. 5,969,441, 6,262,796, and 6,710,849. The basic operating principle behind such multi-stage apparatus is that, while a first substrate table is at the exposure position underneath the projection system for exposure of a first substrate located on that table, a second substrate table can run to a loading position, discharge a previously exposed substrate, pick up a new substrate, perform some initial measurements on the new substrate and then stand ready to transfer the new substrate to the exposure position underneath the projection system as soon as exposure of the first substrate is completed; the cycle then repeats. In this manner, it is possible to increase substantially the machine throughput, which in turn improves the cost of ownership of the machine. It should be understood that the same principle could be used with just one substrate table which is moved between exposure and measurement positions.

Regardless of the type of apparatus used, such an apparatus is typically calibrated upon installation. The installed apparatus is also typically calibrated after major maintenance has been completed on the apparatus to ensure that all of the major components of the apparatus are properly aligned. Where the apparatus is a multi-stage apparatus, or an immersion type apparatus, described above, such calibrations may be time consuming and may require relatively long exposure times for adequate calibration.

Figure 2:
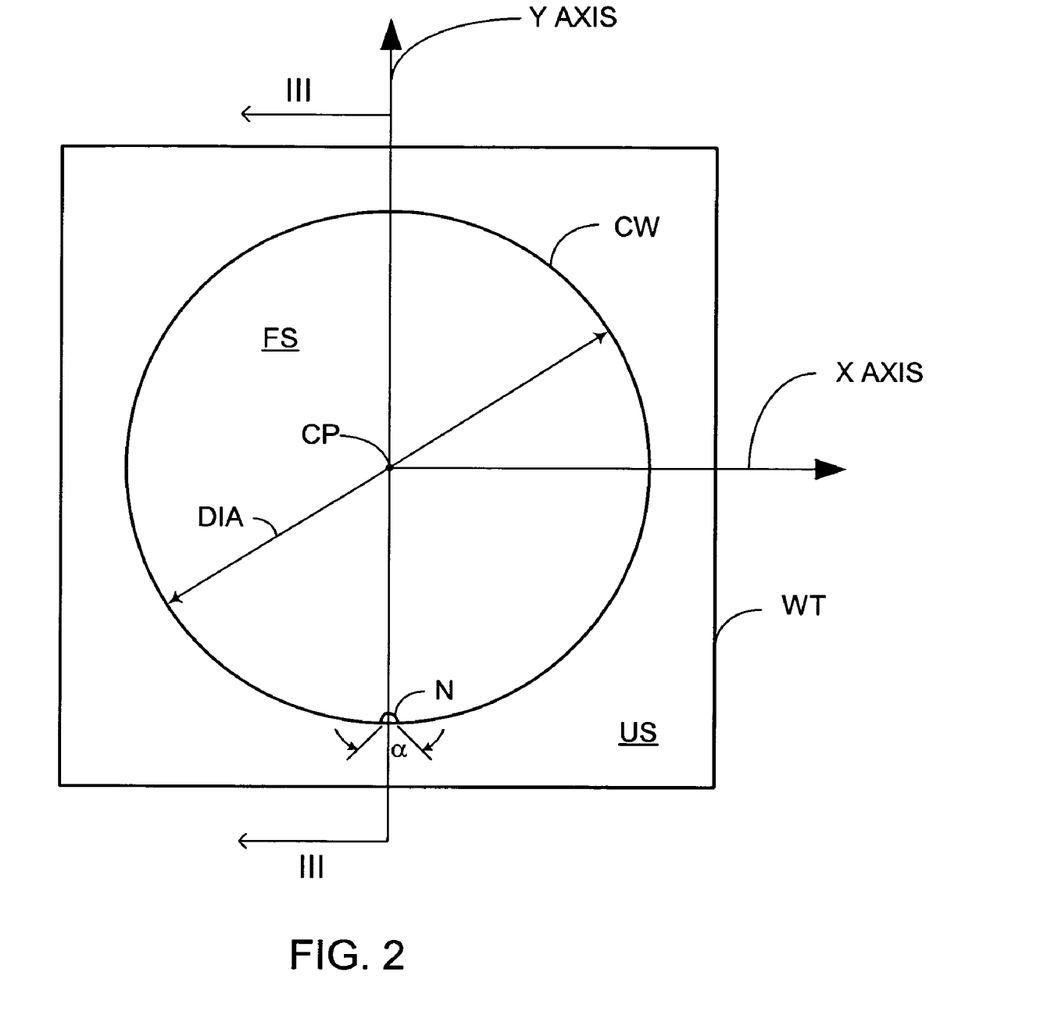
FIG. 2 shows a top view of a substrate table of the lithographic apparatus of FIG. 1 supporting a calibration substrate

FIG. 2 shows a more detailed view of the substrate table WT, or substrate support, of the apparatus 10 of FIG. 1 when the apparatus 10 is being calibrated. As shown in FIG. 2, the substrate table WT is oriented so that an upper surface US of the substrate table WT substantially lies in an XY plane such that movement of the substrate table WT may be defined as being along the X axis and the Y axis. The upper surface US of the substrate table WT supports a calibration substrate CW that is to be used during the calibration of the apparatus 10.

The calibration substrate CW is supported such that the calibration substrate CW may receive the patterned beam of radiation that passes through the projection system PL. Because the same substrate table WT is used to support the calibration substrate CW during calibration of the apparatus 10 and the substrate W during production, in an embodiment, the calibration substrate CW is substantially of the same size and shape as the substrate W configured for the apparatus 10. That is, if the substrate W is a production wafer with a particular diameter, the calibration substrate CW is a wafer with substantially the same diameter as the production wafer. For example, in the embodiment shown in FIGS. 2 and 3, if the apparatus 10 is configured to process 300 mm wafers, the calibration substrate CW should have a diameter DIA of about 300 mm.

Figure 3:
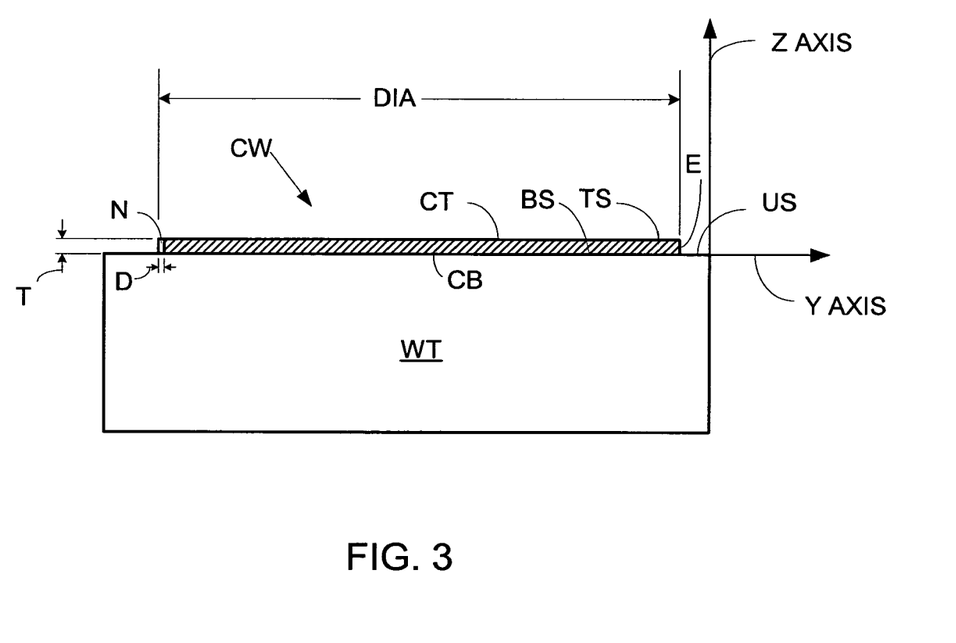
FIG. 3 shows a cross-sectional view of the substrate table and calibration substrate of FIG. 2, taken along line III-III.

As shown in FIG. 3, the calibration substrate CW includes a substantially flat top surface TS, a substantially flat bottom surface BS that is substantially parallel to the top surface TS, and an edge E that connects the top surface TS to the bottom surface BS. In an embodiment, the edge E is substantially perpendicular to the top surface TS and the bottom surface BS, and defines the perimeter of the substrate CW. The edge E may include a notch N. The notch N may have a depth D of about 1.0 mm to about 1.25 mm, and an angle $\alpha$ of about 89° to about 95°. The notch N may be used to align the calibration substrate CW along a particular axis, e.g. the y-axis.

As shown in FIG. 3, the calibration substrate CW includes a center point CP that is substantially in the center of the calibration substrate CW. The thickness T of the calibration substrate CW at the center point CP may be about 755 μm to about 795 μm for a substrate CW with a diameter DIA of about 300 mm. For calibration substrates CW with a diameter DIA of about 200 mm, the thickness T at the center point CP may be about 705 μm to about 745 μm. Local flatness of the calibration substrate CW may be about 150 nm, and warp may be less than about 50 μm. Local flatness and warp may be measured with measurement techniques that are known in the art. For example, local flatness may be determined with SFQR measurement, e.g. 26*8, 95%.

According to the invention, the calibration substrate CW is made from a material that has a low thermal expansion coefficient, i.e. less than about $1.0 \times 10^{-6}$ $K^{-1}$. In an embodiment, the calibration substrate CW is made from a material that has a thermal expansion coefficient of less that about $0.10 \times 10^{-6}$ $K^{-1}$. In an embodiment, the calibration substrate CW is made from a material that has an ultra low thermal expansion coefficient of less than about $0.05 \times 10^{-6}$ $K^{-1}$. Glass ceramic materials are known to have such low thermal expansion coefficients and have been used in lithographic apparatus in, for example, mirrors. As discussed above, calibration substrates are typically made from silicon glass, which has a relatively large thermal expansion coefficient, i.e. $2.5 \times 10$ $10^{-6}$ $K^{-1}$. In an embodiment according to the invention, the calibration substrate CW is made from such a glass ceramic material. In an embodiment, the calibration substrate CW is made from ZERODUR® glass ceramic material, manufactured by Schott AG, Mainz, Germany. In an embodiment, the calibration substrate CW is made from ULE® glass material, manufactured by Corning Inc., Corning, N.Y. In an embodiment, the calibration substrate CW is made from cordierite (magnesium aluminum silicate), manufactured by manufacturers such as Kyocera or Sumikin. In an embodiment, the calibration substrate is made from CLEARCERAM® glass ceramic material manufactured by Kabushiki Kaisha Ohara TA Ohara Inc., Kanagawa, Japan.

Using calibration substrates CW made from a material with a low coefficient of thermal expansion, for example, ZERODUR® glass ceramic material, during the calibration of the apparatus 10 may improve the quality of the calibration, especially in multi-stage and immersion-type apparatus. By using a calibration substrate CW made from a material with a low coefficient of thermal expansion, deformations due to thermal changes in the substrate CW may be reduced. For example, deformations due to the expansion of the substrate CW while being exposed to radiation in the lithographic apparatus may be reduced. Also, deformations due to the shrinkage of the substrate CW while cooling within the lithographic apparatus may also be reduced. Such cooling may be realized, for example, when the calibration substrate CW is used to calibrate an immersion-type apparatus. During the calibration of an immersion-type apparatus, the calibration substrate CW comes into contact with a liquid. As the liquid evaporates, the substrate CW may cool off.

The top surface TS and the bottom surface BS of the calibration substrate CW may be polished. In an embodiment, a coating CT having an optical density of greater than about 5 may be provided on the top surface TS when the calibration substrate CW is made from a transparent material, such as glass. Such a coating CT provides a reflective surface so that light may be reflected from the top surface TS when measurements are being taken during the calibration. In an embodiment, the coating CT comprises titanium nitride, or TiN. The TiN coating may have a thickness of about 200 nm.

The bottom surface BS may include a coating CB to help prevent tribo-electic charging of the calibration substrate CW. The coating CB may have a resistivity of less than about $1 \times 10^9$ $\Omega/cm$. In an embodiment, the coating CB comprises TiN having a thickness of about 100 nm.

Figure 4:
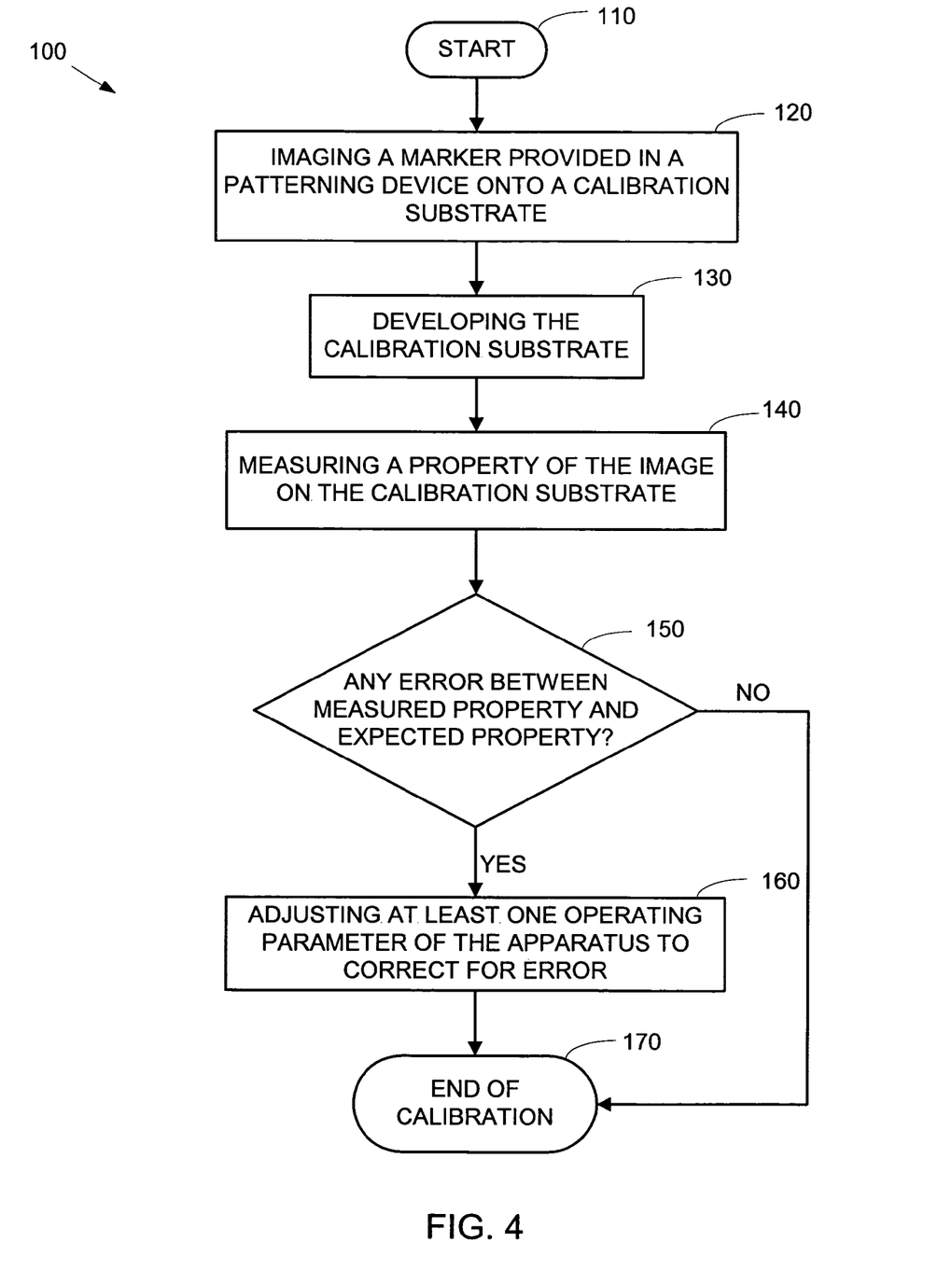
FIG. 4 shows an embodiment of a method of calibrating the lithographic apparatus of FIG. 1, with the calibration substrate of FIG. 2.

FIG. 4 shows an embodiment of a method 100 for calibrating the lithographic apparatus 10 of FIG. 1. The method starts at 110, after the calibration substrate CW made from material with a low thermal expansion coefficient, as defined above, and coated with the radiation-sensitive material has been placed into the apparatus 10 so that it is supported by the substrate table WT. At 120, the projection system PL is used to image a marker of the patterning device MA onto the radiation-sensitive layer of material of the calibration substrate CW. The calibration substrate CW may optionally be removed from the apparatus 10 and developed at 130. At 140, if the calibration substrate has been removed from the apparatus 10, the calibration substrate CW is placed back into the apparatus 10, and at least one property of the image on the calibration substrate CW is measured. Any errors based on any differences between the measured property of the calibration substrate CW and the expected property value, based on the patterning device MA are determined at 150. If no error is determined, the method ends at 170. If an error is determined, the method continues and at least one operating parameter of the apparatus is adjusted to correct for the error at 160. Thus, any adjustments that may be needed to the apparatus 10 may be completed to ensure that the apparatus functions properly during the manufacturing of devices on the apparatus 10. The use of the calibration substrate CW of the present invention may contribute to an improved determination of errors, because the low thermal expansion coefficient of the calibration substrate CW reduces a level of error that may be attributed to the substrate itself, and not to the apparatus 10.

Many different calibrations of the apparatus are typically completed to ensure that the devices that are manufactured on the apparatus are of a high quality. For example, the apparatus may be calibrated to ensure that the patterning device lies in a plane that is perpendicular to the optical path through the projection system PL, that the patterning device stays within this plane during a scan, that the substrate table WT moves as perfectly as possible in the X direction and the Y direction, that the X axis and the Y axis are absolutely perpendicular to each other, that the support structure MT travels as perfectly as possible along the Y axis, and that the calibration substrate is perpendicular to the optical path through the projection system PL, and parallel to the patterning device plane. Additional calibrations may be completed to ensure that the substrate table WT does not rotate or translate during a scan, and that the substrate W is kept in the focal plane throughout its range of motion.

In an embodiment of a calibration, a calibration substrate CW that has been coated with a radiation-sensitive material and has zero-layer marks is placed in the lithographic apparatus 10. A patterning device MA with a plurality of rows containing a plurality of marks is also placed in the apparatus 10. In an initial exposure of the patterning device MA, some of the plurality of rows, preferably the middle rows, are exposed. That is, a beam of radiation PB from the illumination system IL exposes the patterning device MA, and the patterned beam of radiation is projected onto the calibration substrate CW. The patterning device MA is moved along the X or the Y axis by a predetermined amount, for example, by about 640 μm, so that a second exposure may be made. A beam of radiation PB from the illumination system IL exposes the patterning device MA, and a second patterned beam of radiation is projected onto the calibration substrate CW. The second patterned beam of radiation is typically different from the first beam of radiation. The calibration substrate CW is then removed from the apparatus 10, developed, and placed back into the apparatus 10. The location of the images that are now on the calibration substrate CW are measured, and compared with the images on the patterning device MA that was exposed. Any error between the location of the images on the calibration substrate CW and the images in the patterning device MA may be calculated so that the proper steps may be taken to correct for the error.

In an embodiment, a beam of radiation PB from the illumination system IL exposes the entire patterning device MA such that a plurality of images are projected onto the calibration substrate at one time. The calibration substrate CW is removed from the apparatus 10 and developed. The calibration substrate CW is then placed back into the apparatus 10, and the location of the images on the calibration substrate CW are measured. The differences between the location of the images on the patterning device MA and the location of the corresponding images on the calibration substrate CW may be modeled so that the appropriate adjustments, if necessary, may be made to the apparatus 10.

In an embodiment, the "best-focus" of the apparatus 10 may be determined experimentally using known techniques, such as the technique known as "FOCAL." FOCAL is an acronym for FOcus Calibration by using ALignment. It is a best-focus measurement technique for completely determining information about the focal plane using an alignment system of the lithographic apparatus 10. A special, asymmetrically segmented alignment mark is imaged through focus on to the calibration substrate CW. The position of this imaged mark (latent or developed) may be measured by the alignment system. Due to the asymmetric segmentation, the position measured by the alignment system will depend on the defocus used during exposure, thus allowing determination of the best-focus position. By distributing these marks over the whole image field and using different orientation for the segmentation, the complete focal plane for several structure orientations can be measured. This technique is described in more detail in U.S. Pat. No. 5,674,650, which is incorporated herein by reference.

In an embodiment, a patterning device that has been configured for focus calibration, such as a patterning device MA that contains a plurality of fields, each with a different focus setting, is placed in the apparatus 10. A calibration substrate CW is also placed in the apparatus 10. The patterning device MA is exposed by the beam of radiation such that the images on the patterning device MA are projected onto the calibration substrate CW with the projection system PL. The patterning device MA is exposed a plurality of times, each with a different exposure energy. Once the exposure of the patterning device MA is complete, the calibration substrate CW is removed from the apparatus 10, developed, then placed back into the apparatus 10. The images on the calibration substrate CW are measured for width and thickness, and are compared to the images on the patterning device MA, as well as the exposure energies used to expose the patterning device MA. The data may be modeled so that any adjustments needed to the apparatus may be properly identified.

In an embodiment, the entire patterning device MA, which has a plurality of rows containing a plurality of marks, is exposed at one time. The beam of radiation PB from the illumination system IL is patterned by the patterning device MA and is projected onto the calibration substrate CW by the projection system PL. The calibration substrate CW is removed from the apparatus 10, developed, then placed back into the apparatus 10. The dimensions, e.g. the width and depth, of each of the marks now on the calibration substrate CW are measured and compared to the marks on the patterning device MA. The data may be modeled so that the proper adjustments may be made to correct for properties including, but not limited to focus, tilt, and field curvature.

In an embodiment, calibrations are completed to correct for any non-orthogonality of the substrate table WT. For the substrate W to be positioned relative to the patterning device MA properly, the X axis and the Y axis of the substrate table WT should be as close to perpendicular to each other as possible. In this embodiment, a calibrated orthogonal substrate may be used. The calibrated orthogonal substrate includes one row of marks on the X axis, and one row of marks on the Y axis. The location of the marks are measured and are compared to the expected position. Any error detected is attributed to the wafer stage non-orthogonality, and the proper compensations may be made to correct for the detected non-orthogonality.

In an embodiment, when a preexisting calibrated orthogonal substrate is not available, a calibrated orthogonal substrate is created. To create the calibrated orthogonal substrate, a blank coated substrate is loaded into the apparatus. A patterning device MA with a specific image that includes a row of marks in the X axis, each mark being, for example, 5 mm apart, and a column of marks in the Y axis, each mark being, for example, 5 mm apart. The patterning device MA is exposed by a beam of radiation PB from the illumination system IL, and the exposed image is projected onto the calibration substrate CW. The calibration substrate CW is removed from the apparatus, developed, then loaded back into the apparatus with a 90° rotation so that the X marks are on the Y axis and the Y marks are on the X axis. If the substrate table is indeed orthogonal, the X axis marks will be placed exactly on the Y axis, and the Y axis marks will be placed exactly on the X axis. The marks are then measured, and the actual position is compared to the expected position, and any error detected in the X axis or the Y axis may be attributed to the non-orthogonality of the substrate table WT. Measurement of the marks also allows for the calculation of any Y error in the Y axis and any X error in the X axis. Such a calculation provide information as to whether the movements in the X and Y directions are equal. This calibration may be referred to as y to x scaling.

It will be appreciated that by minimizing any outside effects of the calibration substrate that is used in any of the aforementioned calibrations, improved calibrations may be realized, because the impact of an uncontrolled variable has been minimized. That is, by providing calibration substrates that are made from a material with a low thermal expansion coefficient, as defined above, any temperature variations both before and during exposure should be minimized.

While preferred embodiments of the invention have been shown and described, they are not intended to be limiting in any respect. To the contrary, the invention is intended to encompass all variations and modifications within the spirit and scope of the appended claims.

What is claimed is:

1. A calibration substrate for use during calibration of a lithographic apparatus, the calibration substrate comprising:
    a first substantially flat surface;
    a second substantially flat surface that is substantially parallel to the first surface; and
    an edge that connects the first surface to the second surface, wherein the calibration substrate has a thermal expansion coefficient of less than about $1.0 \times 10^{-6}$ $K^{-1}$ to reduce deformation thereof due to thermal changes in the substrate while in the lithographic apparatus.

2. A calibration substrate according to claim 1, wherein the thermal expansion coefficient is less than about $0.1 \times 10^{-6}$ $K^{-1}$.

3. A calibration substrate according to claim 2, wherein the thermal expansion coefficient is less than about $0.05 \times 10^{-6}$ $K^{1}$.

4. A calibration substrate according to claim 1, wherein said thermal changes comprise expansion of the substrate.

5. A calibration substrate according to claim 1, wherein said thermal changes comprise shrinkage of the substrate.

6. A calibration substrate according to claim 1, wherein the material is a glass ceramic material.

7. A calibration substrate according to claim 6, wherein the material is ZERODUR® glass ceramic material.

8. A calibration substrate according to claim 6, wherein the material is CLEARCERAM® glass ceramic material.

9. A calibration substrate according to claim 1, wherein the material is a glass material.

10. A calibration substrate according to claim 9, wherein the material is ULE® glass material.

11. A calibration substrate according to claim 1, wherein the material is cordierite.

12. A calibration substrate according to claim 1, wherein the first surface and the second surface each have a diameter of about 200 mm.

13. A calibration substrate according to claim 12, wherein a thickness of the substrate at a center point of the first surface is about 705 µm to about 745 µm.

14. A calibration substrate according to claim 1, wherein the first surface and the second surface each have a diameter of about 300 mm.

15. A calibration substrate according to claim 14, wherein a thickness of the substrate at a center point of the first surface is about 755 µm to about 795 µm.

16. A calibration substrate according to claim 1, wherein the edge comprises a notch.

17. A calibration substrate according to claim 1, wherein the first surface comprises a coating having an optical density of greater than about 5.

18. A calibration substrate according to claim 17, wherein the coating comprises TiN.

19. A calibration substrate according to claim 18, wherein the coating has a thickness of about 200 nm.

20. A calibration substrate according to claim 1, wherein the second surface comprises a coating having a volume resistivity of less than about $1 \times 10^9$ Ω/cm.

21. A calibration substrate according to claim 20, wherein the coating comprises TiN.

22. A calibration substrate according to claim 21, wherein the coating has a thickness of about 100 nm.

23. A method for calibrating a lithographic apparatus, the method comprising:
    imaging a marker provided on a patterning device onto a radiation-sensitive layer on a calibration substrate with a beam of radiation;
    measuring a property of the image of the marker on the calibration substrate;
    determining any error between the measured property and an expected property based on the marker and operating parameters of the apparatus; and
    adjusting at least one of the operating parameters of the apparatus to correct for the error,
    wherein the calibration substrate comprises a first substantially flat surface, a second substantially flat surface that is substantially parallel to the first surface, and an edge that connects the first surface to the second surface, and
    wherein the calibration substrate has a thermal expansion coefficient of less than about $1.0 \times 10^{-6}$ $K^{-1}$ to reduce deformation thereof due to thermal changes in the substrate while in the lithographic apparatus.

24. A method according to claim 23, wherein the thermal expansion coefficient is less than about $0.10 \times 10^{-6}$ $K^{-1}$.

25. A method according to claim 24, wherein the thermal expansion coefficient is less than about $0.05 \times 10^{-6}$ $K^{-1}$.

26. A method according to claim 23, wherein said thermal changes comprise expansion of the substrate.

27. A method according to claim 23, wherein said thermal changes comprise shrinkage of the substrate.

28. A method according to claim 23, wherein the material is a glass ceramic material.

29. A method according to claim 28, wherein material is ZERODUR® glass ceramic material.

30. A method according to claim 23, wherein the calibration substrate has a diameter of about 300 mm.

31. A method according to claim 23, wherein the calibration substrate has a diameter of about 200 mm.

32. A method according to claim 23 wherein the marker comprises a plurality of marks.

33. A method according to claim 23, wherein said measuring the property comprises measuring a position of the image of the marker.

34. A method according to claim 33, wherein said position comprises an X position and a Y position.

35. A method according to claim 34, wherein said operating parameter comprises the orthogonality of the substrate table.

36. A method according to claim 23, wherein said measuring the property comprises measuring positions of the developed images of the marks.

37. A method according to claim 36, wherein said adjusting at least one operating parameter comprises adjusting focus and dose parameters of the apparatus.

38. A method for manufacturing a device using a lithographic apparatus, the method comprising:
    calibrating the lithographic apparatus with a calibration substrate, the calibration substrate comprising a first substantially flat surface, a second substantially flat surface that is substantially parallel to the first surface, and an edge that connects the first surface to the second surface, wherein the calibration substrate has a thermal expansion coefficient of less than about $1.0 \times 10^{-6}$ $K^{-1}$ to reduce deformation thereof due to thermal changes in the calibration substrate while in the lithographic apparatus;

patterning a beam of radiation;

projecting a patterned beam of radiation onto a target area of a radiation sensitive material of a production substrate.

39. A device manufactured according to the method of claim 38.

40. A lithographic apparatus in combination with a calibration substrate for use during calibration of the lithographic apparatus, the lithographic apparatus comprising:

an illumination system for conditioning a beam of radiation;

a support structure for supporting a patterning device, the patterning device serving to impart the beam of radiation with a pattern in its cross-section;

a substrate table for holding the calibration substrate; and a projection system for projecting the patterned beam of radiation onto a target portion of the calibration substrate, and the calibration substrate comprising a first substantially flat surface;

a second substantially flat surface that is substantially parallel to the first surface; and an edge that connects the first surface to the second surface, wherein the calibration substrate has a thermal expansion coefficient of less than about $1.0 \times 10^{-6}$ $K^{-1}$ to reduce deformation thereof due to thermal changes in the substrate while in the lithographic apparatus.

41. A combination according to claim 40, wherein the material has a thermal expansion coefficient of less than about $0.10 \times 10^{-6}$ $K^{-1}$.

42. A combination according to claim 40, wherein the material is a glass ceramic material.

43. A combination according to claim 42, wherein the material is ZERODUR® glass ceramic material.

44. A combination according to claim 40, wherein the calibration substrate has a diameter of about 300 mm.

45. A combination according to claim 40, wherein the calibration substrate has a diameter of about 200 mm.

* * * * *